(12) United States Patent
Scanlan

(10) Patent No.: US 7,851,894 B1
(45) Date of Patent: Dec. 14, 2010

(54) SYSTEM AND METHOD FOR SHIELDING OF PACKAGE ON PACKAGE (POP) ASSEMBLIES

(75) Inventor: Christopher M. Scanlan, Hellerup (DK)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/342,829

(22) Filed: Dec. 23, 2008

(51) Int. Cl.
*H01L 23/552* (2006.01)

(52) U.S. Cl. .................. 257/659; 257/660; 257/686; 257/690; 257/E23.114; 257/E23.116; 257/E23.133

(58) Field of Classification Search .............. 257/659, 257/660, 686, 690, E23.116, E23.133, E23.114
See application file for complete search history.

(56) References Cited

U.S. PATENT DOCUMENTS

| | | | |
|---|---|---|---|
| 4,925,024 A | 5/1990 | Ellenberger et al. | |
| 5,166,772 A | 11/1992 | Soldner et al. | |
| 5,416,358 A | 5/1995 | Ochi et al. | |
| 5,468,999 A | 11/1995 | Lin et al. | |
| 5,473,191 A | 12/1995 | Tanaka | |
| 5,557,142 A | 9/1996 | Gilmore et al. | |
| 5,608,265 A * | 3/1997 | Kitano et al. ............... | 257/738 |
| 5,614,694 A | 3/1997 | Gorenz, Jr. et al. | |
| 5,639,989 A | 6/1997 | Higgins, III | |
| 5,656,864 A | 8/1997 | Mitsue et al. | |
| 5,694,300 A | 12/1997 | Mattei et al. | |
| 5,726,493 A * | 3/1998 | Yamashita et al. ........... | 257/698 |
| 5,907,477 A | 5/1999 | Tuttle et al. | |
| 5,940,271 A | 8/1999 | Mertol | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,602,737 B2 | 8/2003 | Wu | |
| 6,686,649 B1 | 2/2004 | Mathews et al. | |
| 6,815,254 B2 * | 11/2004 | Mistry et al. ................ | 438/108 |
| 7,030,469 B2 | 4/2006 | Mahadevan et al. | |
| 2002/0089832 A1 | 7/2002 | Huang | |
| 2003/0067757 A1 | 4/2003 | Richardson et al. | |
| 2004/0145051 A1 * | 7/2004 | Klein et al. ................. | 257/734 |
| 2005/0029644 A1 * | 2/2005 | Ho et al. ..................... | 257/686 |
| 2005/0184377 A1 * | 8/2005 | Takeuchi et al. ............ | 257/686 |
| 2005/0205978 A1 * | 9/2005 | Pu et al. ..................... | 257/678 |
| 2005/0280139 A1 | 12/2005 | Zhao et al. | |
| 2006/0244131 A1 * | 11/2006 | Kobayashi et al. .......... | 257/724 |
| 2007/0030661 A1 | 2/2007 | Morris et al. | |
| 2007/0176281 A1 | 8/2007 | Kim et al. | |

(Continued)

*Primary Examiner*—Eugene Lee
*Assistant Examiner*—Peniel M Gumedzoe
(74) *Attorney, Agent, or Firm*—Weiss & Moy, P.C.

(57) ABSTRACT

A semiconductor package has a first substrate having a plurality of metal traces. At least one die is electrically coupled to the first surface of the first substrate. A plurality of land pads is formed on the first surface of the first substrate. A mold compound encapsulates portions of the die and portions of the first surface of the first substrate. A conductive coating is applied to the mold compound and electrically coupled to at least one metal trace. A non-conductive coating is formed over the conductive coating and portions of the mold compound. A plurality of vias is formed through the non-conductive coating and the mold compound to expose the land pads.

17 Claims, 6 Drawing Sheets

U.S. PATENT DOCUMENTS

2007/0181989 A1* 8/2007 Corisis et al. ............... 257/686
2008/0149381 A1* 6/2008 Kawagishi et al. .......... 174/261
2008/0230887 A1 9/2008 Sun et al.
2009/0014858 A1* 1/2009 Boon et al. ................. 257/686
2009/0152715 A1* 6/2009 Shim et al. ................. 257/737

* cited by examiner

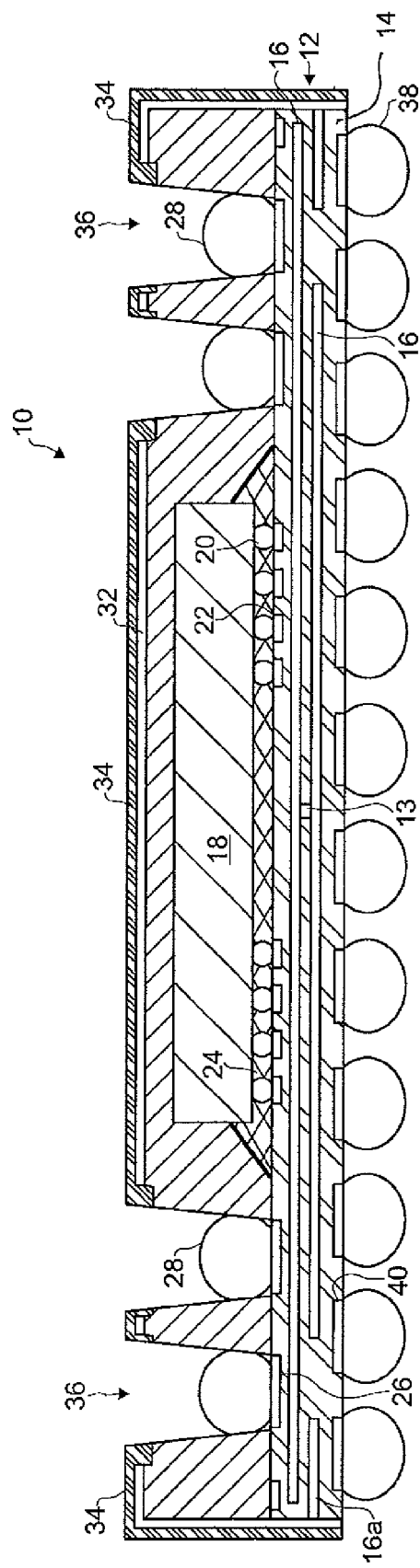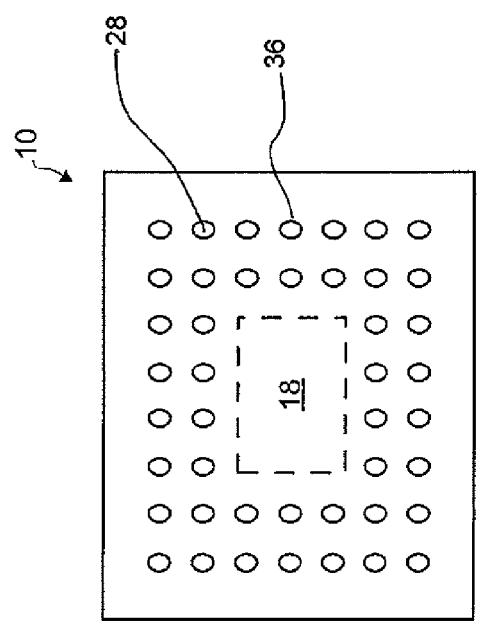
Fig. 1
Fig. 2

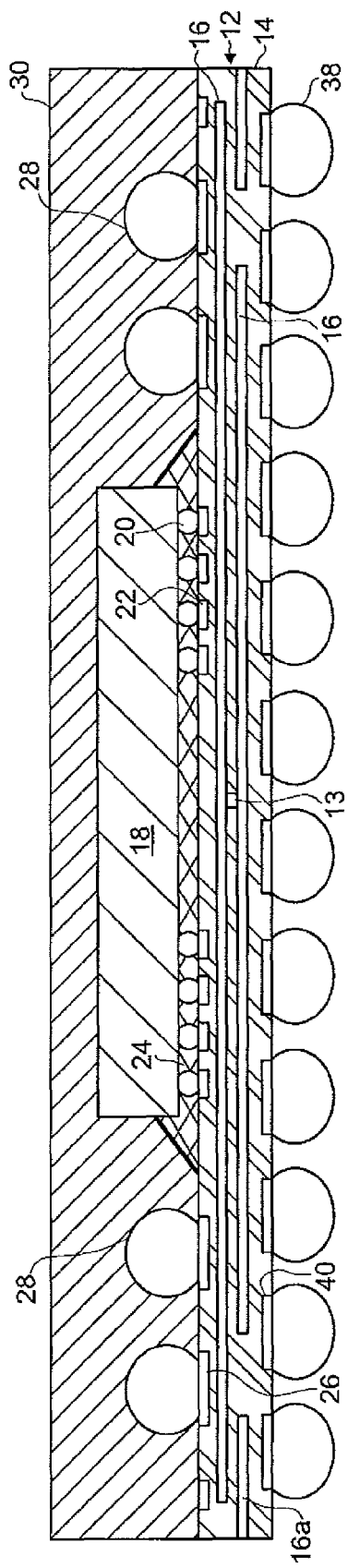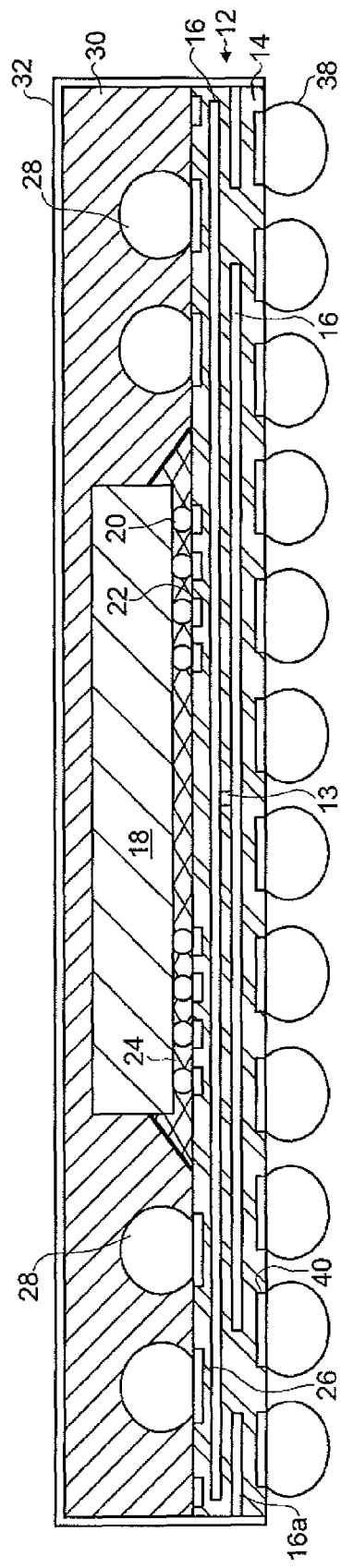
Fig. 4A
Fig. 4B

SYSTEM AND METHOD FOR SHIELDING OF PACKAGE ON PACKAGE (POP) ASSEMBLIES

FIELD OF THE INVENTION

This invention relates to Radio Frequency (RF) shielding and, more specifically, to a system and method for providing an RF shield for a Package on Package (PoP) base package which leaves contacts of the base package exposed and available for mounting another PoP package on the base package while reducing the possibility of shorting the shield material to a PoP solder joint.

BACKGROUND OF THE INVENTION

Radio Frequency (RE) shielding is required on certain semiconductor devices in order to minimize Electro-Magnetic Interference (EMI) radiation from the semiconductor device. RE shielding is further required to prevent RF radiation from external sources from interfering with operation of the semiconductor device.

RF shielding is generally accomplished in one of three ways. A first method is to attach a metal can over the component after the component is attached to the motherboard. However, shield attach on the mother board has several problems. First, shield attach can be costly and a low yielding process. External shields soldered to the motherboard further require additional board space.

An alternative to the shield attached method described above is an embedded RF shield. In an embedded shield, the metal RF shield is directly attached to the semiconductor package substrate by means of solder or a conductive adhesive. The shield may be fully embedded within the mold compound of the finished package or can be exposed after assembly. In either case, the addition of a metal shield as a component attached to the top surface of the substrate is problematic for several reasons. First, the addition of a metal shield as a component attached to the top surface of the substrate requires a significant amount of additional space on the package substrate and adds additional thickness to the package. Second, it can be difficult to transfer mold in and around the metal shield to fully encapsulate the semiconductor package. Shield attach is also problematic due to flux creep during shield attach which may cause delamination and extrusion issues The third method is the conventional conformal shield. In this method, all of the components are placed on the substrate and the substrate, or strip, is over-molded using unit molding, or pin gate molding where individual mold caps are defined within the strip such that upward facing, exposed pads in the substrate remain exposed after the mold operation. A conductive material is then applied to the strip such that it covers the units and also makes electrical contact to the upward facing pads. The strip is then singulated into individual units. While this technique eliminates the molding process concerns associated with the aforementioned embedded shield method, it does not eliminate the added substrate size required to form the so-called upward facing, exposed pads.

POP packages create a problem for RF shielding. For a PoP package, the ground connection for the RF shield must be electrically isolated from functional ground signals for the base/bottom and top PoP packages. In order to meet this requirement, the PoP base package must be shielded on the top and 4 sides of the package, while leaving contacts on the base package exposed and available for mounting the top PoP package. In addition, there can be no possibility to short the shield material to the PoP solder joint.

Therefore, a need existed to provide a system and method to overcome the above problem. The system and method would provide an RF shield for a PoP base package which leaves contacts on the base package exposed and available for mounting a top PoP package while reducing the possibility of shorting the shield material to a PoP solder joint.

SUMMARY OF THE INVENTION

A semiconductor package has a first substrate having a plurality of metal traces. At least one die is electrically coupled to the first surface of the first substrate. A plurality of land pads is electrically coupled to the first surface of the first substrate. A mold compound encapsulates portions of the die and portions of the first surface of the first substrate. A conductive coating is applied to the mold compound and electrically coupled to at least one metal trace. A non-conductive coating is formed over the conductive coating and portions of the mold compound. A plurality of vias is formed through the non-conductive coating and the mold compound to expose the land pads.

The present invention is best understood by reference to the following detailed description when read in conjunction with the accompanying drawings.

BRIEF DESCRIPTION OF THE DRAWINGS

FIG. 1 is a cross-sectional side view of the semiconductor package of the present invention; and FIG. 2 is a top view of the semiconductor package depicted in FIG. 1;

FIGS. 4A-4E depicts a sequence of steps which may be used to fabricate the semiconductor device depicted in FIG. 1.

Common reference numerals are used throughout the drawings and detailed description to indicate like elements.

DETAILED DESCRIPTION

Figure 3:
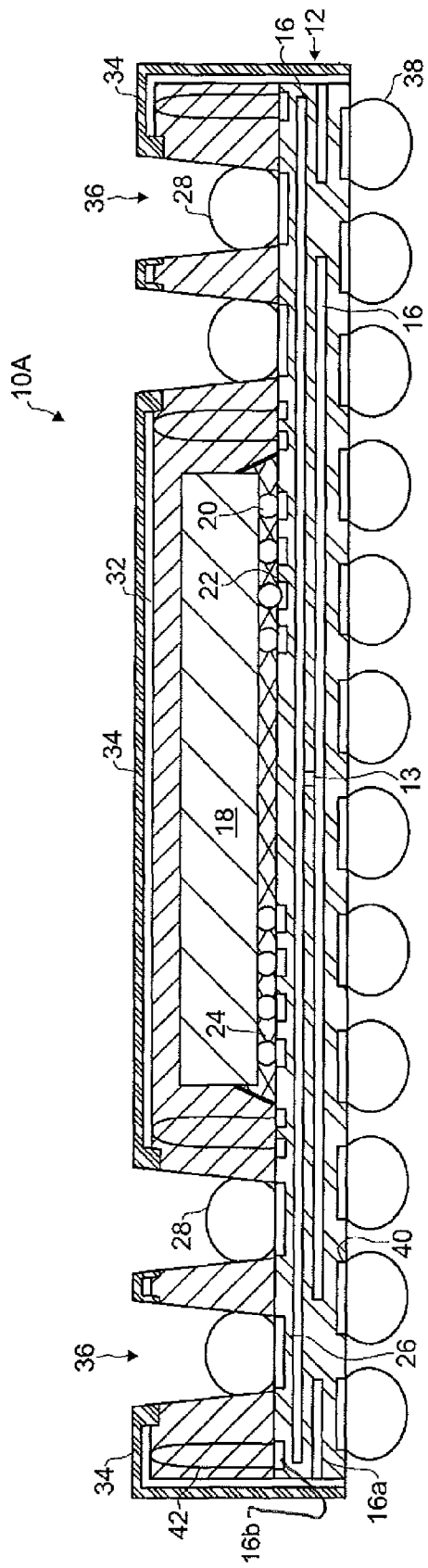
FIG. 3 is cross-sectional side view of the semiconductor package of the present invention using a wire bonds for attaching the conductive coating to ground planes.

Referring to FIGS. 1 and 2, a semiconductor package 10 is shown. The semiconductor package 10 is a base package for mounting one or more additional semiconductor packages thereon. The semiconductor package 10 provides an RF shield which leaves land pads exposed and available for mounting an additional semiconductor package while reducing the possibility of shorting the shield material to a solder joint.

The package 10 has a first substrate 12. The first substrate 12 may be any one chosen from a conventional rigid PCB, a flexible PCB, and an equivalent thereof, but the kind of first substrate 12 is not limited herein. The first substrate 12 includes an insulation layer 14 having predetermined area and thickness. The insulation layer 14 has an approximately planar first surface and an approximately planar second surface opposing the first surface. The first substrate 12 has a plurality of metal traces 16 formed on the first surface of the insulation layer 14. A plurality of metal traces 16 may also be formed on the second surface of the insulation layer 14. The number of metal traces 16 is not limited to the number shown in FIG. 1. If multiple layers of metal traces 16 are formed, a dielectric layer may be applied between the metal traces 16. The dielectric layer is used as an insulating layer to separate multiple signal layers. Metal filled vias 13 are used to mechanically and electrically connect the layers of metal traces 16. A soldermask may be placed over the top surface of the metal traces 16 formed on the first substrate 12. The soldermask is used to protect the metal traces 16.

One or more dies 18 are attached to a first surface of the first substrate 12. The dies 18 may be any type of device. For example, the die 18 may be a memory device, a logic device, an ASIC device, and other like elements. It should be noted that the listing of the above types of die 18 is given as an example and should not be seen as to limit the scope of the present invention. Different methods may be used to electrically couple the die 18 to the first substrate 12. Wirebonds, surface mount technology, die stacking technology, flip chip technology, and the like may be used. The listing of the above is given as an example and should not be seen as to limit the scope of the present invention.

In the embodiment shown in FIG. 1, the die 18 is electrically connected to the first surface of the substrate 12 through the use of flip chip technology. The die 18 will have a plurality of contacts 20 attached to a bottom surface of the die 18. The contacts 20 are attached to the metal traces 16 formed on the first surface of the substrate 12 thereby electrically connecting the die 18 to the first surface of the substrate 12. In the present embodiment, the contacts 20 are solder bumps. The contacts 20 are generally connected to the die 18 and metal traces 16 through the use of bond pads 22. A reflow process may be used to couple the solder bumps to the bond pads 22 on the dies 18 and the metal traces 16.

The process of flip chip mounting generally leaves spaces between the first surface of the substrate 12 and the bottom surface of the die 18. An underfill 24 is generally used to fill the gap between the bottom surface of the die 18 and the first surface of the substrate 12. The underfill 24 may be the same or different than the material used to encapsulate the package 10.

A plurality of land pads 26 are formed around a perimeter of the first surface of the substrate 12 and attached to at least one metal trace 16. Each land pad 26 is used to electrically couple a second package to the base package 10. In accordance with the embodiment shown in FIGS. 1 and 2, a contact 28 is attached to each land pad 26. The contact 28 is generally a solder ball/bump. A reflow process may be used to couple the solder ball/bumps to the land pads 26. The contact 28 is optional. In some embodiments, particularly when the mold compound 32 is very thin and the diameter of the via 36 is large, contacts 28 may not be required.

A mold compound 30 is used to encapsulate the package 10. The mold compound 30 is mainly made of non-conductive resin, film, or the like. The mold compound 30 is used to encapsulate the die 18, exposed areas on the first surface of the substrate 12, and the contacts 28.

In the embodiment shown in FIGS. 1 and 2, a set of metal traces 16a are exposed on a side surface of the substrate 12. In the embodiment depicted in FIG. 1, the side surface is approximately perpendicular to the first and second surfaces of the first substrate 12. All four sides of the package 10 may be formed so that at least one of the metal traces 16a is exposed on each side surface of the package 10. The metal traces 16a are used as ground pads for a Radio Frequency (RF) shield. Different methods may be used to expose the metal traces 16a. For example, the exposed metal traces 16a may be formed through a partial or full saw cut process. Vias may also be used to expose the metal traces 16a. The vias may be formed through the mold compound 30 to expose the metal traces 16a. If vias are used, the exposed metal traces 16a will generally be on the first surface of the substrate 12.

A conductive coating 32 is then applied to the package 10. The conductive coating 32 is used to provide RF shielding for the package 10. The conductive coating 32 may be applied by plating, vacuum printing, vacuum deposition, insert molding, spray coating, and the like. The conductive coating 32 is applied to the top surface of the package 10 and to the side surfaces of the package 10. The conductive coating 32 is applied so that the conductive coating 32 will be in contact with the exposed metal traces 16a. Thus, the package 10 will have a conductive coating 32 that contacts grounded metal. If all four sides of the package 10 have exposes metal traces 16a, the conductive coating 32 will contact ground metal on all four sides of the package 10.

The conductive coating 32 above each of the contacts 28 (or above the land pad 26 if contacts 28 are not used) is removed. In general, the amount of conductive coating 32 removed is slightly more than the width of the contact 28. The conductive coating 32 may be removed via a mask printing process, a laser ablation process, a selective plating process, and the like. Other methods may be used to remove the conductive coating 32 without departing from the spirit and scope of the present invention.

A non-conductive coating 34 is then applied to the package 10 and cured. The non-conductive coating 34 is applied to the conductive coating 32 and to the mold compound 30 where the conductive coating 32 was removed. The non-conductive coating 34 will cover the exposed sections of the conductive coating 32. The non-conductive coating 34 may be a ceramic, silicon, a polymer, or the like. The listing of the above types of non-conductive coatings 34 is given as an example and should not be seen as limiting the scope of the present invention.

A plurality of vias 36 is formed in the package 10. Each of the vias 36 extends through the non-conductive coating 34 and the mold compound 30 to a top surface of a respective contact 28 (or all the way to the land pads 26 if contacts 28 are omitted). Each of the vias 36 has a frusto-conical configuration having the non-conductive coating 34 formed around the inner top perimeter of each via 36. In general, the number of vias 36 formed in the package 10 conforms to the number of contacts 28. The vias 36 allow contacts from another package to be placed on top of the package 10 and be in electrically coupled to the contacts 28.

A set of contacts 38 may be coupled to the second surface of the substrate 12. In the embodiment shown in FIG. 1, the contacts 38 are solder balls. If solder balls are used, the solder balls will be electrically coupled to the second surface of the substrate 12 via land pads 40. In general, a reflow process may be used to couple the solder balls to the bond pads 40 formed on the second surface of the substrate 12. Alternative methods may be used to couple different types of contacts to the first substrate 12 without departing from the spirit and scope of the present invention.

The package 10 provides shielding on a top surface and all four sides surfaces of the package 10 and provides isolation between the package 10 and a package to be stacked on a top surface of the package 10. The shielding on the top surface has minimal openings that allow another package to be electrically coupled to the package 10. The non-conductive coating 34 provides isolation between the conductive coating 32 and signal transmitted from solder joints between the stacked packages.

Referring now to FIG. 3, another embodiment of the package 10A is shown. The package 10A has a first substrate 12. The first substrate 12 includes an insulation layer 14 having an approximately planar first surface and an approximately planar second surface opposing the first surface. The first substrate 14 has a plurality of metal traces 16 formed on the first surface of the insulation layer 14. A plurality of metal traces 16 may also be formed on the second surface of the insulation layer 14. If multiple layers of metal traces 16 are formed, a dielectric layer may be applied between the metal traces 16. Metal filled vias 13 are used to mechanically and electrically connect the layers of metal traces 16. A soldermask may be placed over the top surface of the metal traces 16 formed on the first substrate 12. The soldermask is used to protect the metal traces 16.

One or more dies 18 are attached to a first surface of the first substrate 12. Different methods may be used to electrically couple the die 18 to the first substrate 12. Wirebonds, surface mount technology, through hole technology, flip chip technology, and the like may be used. The listing of the above is given as an example and should not be seen as to limit the scope of the present invention.

In the embodiment shown in FIG. 3, the die 18 is electrically connected to the first surface of the substrate 12 through the use of flip chip technology. The die 18 will have a plurality of contacts 20 attached to a bottom surface of the die 18. The contacts 20 are attached to the metal traces 16 formed on the first surface of the substrate 12 thereby electrically connecting the die 18 to the first surface of the substrate 12. In the present embodiment, the contacts 20 are solder bumps. The contacts 20 are generally connected to the die 18 and metal traces 16 through the use of bond pads 22. An underfill 24 is generally used to fill the gap between the bottom surface of the die 18 and the first surface of the substrate 12. The underfill 24 may be the same or different than the material used to encapsulate the package 10A.

A plurality of land pads 26 are formed around a perimeter of the first surface of the substrate 12 and attached to at least one metal trace 16. Each land pad 26 is used to electrically couple a second package to the base package 10A. In the embodiment shown in FIG. 3, a contact 28 is attached to each bond pad 26. The contact 28 is generally a solder ball/bump. A reflow process may be used to couple the solder ball/bumps to the land pads 26. The contact 28 is optional. In some embodiments, particularly when the mold compound 32 is very thin and the diameter of the via 36 is large, contacts 28 may not be required.

A plurality of metal wires 42 are electrically coupled to one of the metal traces 16 formed on the first surface of the insulation layer 14. In general, the metal wires 42 are wirebonded to a grounded metal trace 16b formed on the first surface of the insulation layer 14. In accordance with one embodiment, both ends of the metal wires 42 are electrically coupled to the metal traces 16b so that the metal wires 42 form a loop. The metal wires 42 may be gold, copper, aluminum, or the like. The listing of the above is given as examples and should not be seen as to limit the scope of the present invention.

A mold compound 30 is used to encapsulate the semiconductor device 10A. The mold compound 30 is mainly made of non-conductive material, which is applied on the top surface of the die 18 and the substrate 12. During the process of applying the mold compound 30, the loops formed by the metal wires 42 are compressed by the mold tooling so that the top of the loop of the metal wires 42 are exposed on the top of the package 10A after molding. A cleaning process may be performed to remove any mold compound 42 that may have formed on the top of the loop of the metal wires 42. The cleaning process will clean the contact area of the metal wire 42, resulting in increased contact area and reduced contact resistance between the metal wire 42 and the conductive coating 32 to be applied. The cleaning process may be done by chemical removal process, a grinding process or other physical abrasion techniques, laser ablation, and the like. The listing of the above is given as examples and should not be seen as to apply to a specific embodiment or to limit the scope of the present invention.

The conductive coating 32 is then applied to the package WA. The conductive coating 32 is applied to the top surface of the package 10A and to the side surfaces of the package 10A. The conductive coating 28 is applied so that the conductive coating 28 is in contact with the exposed portion of the top of the loop of the metal wires 42. The conductive coating 32 may further be applied so that the conductive coating 32 will be in contact with the exposed metal traces 16a. Thus, the semiconductor device 10A will have a conductive coating 28 that contacts grounded metal. The conductive coating 32 is used to provide RF shielding for the package 10A. The conductive coating 32 may be applied by plating, vacuum printing, vacuum deposition, insert molding, spray coating, and the like. The conductive coating 32 may be applied by plating, vacuum printing, vacuum deposition, insert molding, spray coating, and the like. In FIG. 3, the conductive coating 32 is a conformal coating. In a conformal coating, a thin layer of the conductive coating 32 is applied to the top surface of the semiconductor package 10A.

The conductive coating 32 above each of the contacts 28 (or above the land pad 26 if contacts 28 are not used) is removed. In general, the amount of conductive coating 32 removed is slightly more than the width of the contact 28. The conductive coating 32 may be removed mask printing process, a selective plating process, and the like. Other methods may be used to remove the conductive coating 32 without departing from the spirit and scope of the present invention.

A non-conductive coating 34 is then applied to the package 10A and cured. The non-conductive coating 34 is applied to the conductive coating 32 and to the mold compound 30 where the conductive coating 32 was removed. The non-conductive coating 34 will cover the exposed sections of the conductive coating 32. The non-conductive coating 34 may be a ceramic, silicon, a polymer, or the like. The listing of the above types of non-conductive coatings 34 is given as an example and should not be seen as limiting the scope of the present invention.

A plurality of vias 36 is formed in the package 10A. Each of the vias 36 extends through the non-conductive coating 34 and the mold compound 30 to a top surface of a respective contact 28 (or above the land pad 26 if contacts 28 are not used). Each of the vias 36 has a frusto-conical configuration having the non-conductive coating 34 formed around the inner top perimeter of each via 36. In general, the number of vias 36 formed in the package 10A conforms to the number of contacts 28/land pads 26. The vias 36 allow contacts from another package to be placed on top of the package 10A and be in electrically coupled to the contacts 28/land pads 26.

A set of contacts 38 may be coupled to the second surface of the substrate 12. In the embodiment shown in FIG. 3, the contacts 38 are solder balls. If solder balls are used, the solder balls will be electrically coupled to the second surface of the substrate 12 via land pads 40. In general, a reflow process may be used to couple the solder balls to the bond pads 40 formed on the second surface of the substrate 12. Alternative methods may be used to couple different types of contacts to the first substrate 12 without departing from the spirit and scope of the present invention.

Referring now to FIGS. 4A-4D, a sequence of steps is shown which may be utilized to facilitate the fabrication of the package 10. In the initial step, a one or more dies 18 are attached to a first surface of the first substrate 12. Different methods may be used to electrically couple the die 18 to the first substrate 12. Wirebonds, surface mount technology, die stacking technology, flip chip technology, and the like may be used. The listing of the above is given as an example and should not be seen as to limit the scope of the present invention. In the embodiment shown in FIG. 4A, the die 18 is electrically connected to the first surface of the substrate 12 through the use of flip chip technology. The die 18 will have a plurality of contacts 20 attached to a bottom surface of the die 18. The contacts 20 are attached to the metal traces 16 formed on the first surface of the substrate 12. The contacts 20 are generally connected to the die 18 and metal traces 16 through the use of bond pads 22. A reflow process may be used to couple the solder bumps to the bond pads 22 on the dies 18 and the metal traces 16. An underfill 24 is generally used to fill the gap between the bottom surface of the die 18 and the first surface of the substrate 12.

A plurality of land pads 26 are formed around a perimeter of the first surface of the substrate 12 and attached to at least one metal trace 16. Each land pad 26 is used to electrically couple a second package to the base package 10. A contact 28 is attached to each bond pad 26. The contact 28 is generally a solder ball/bump. The A reflow process may be used to couple the solder ball/bumps to the land pads 26. The contact 28 is optional. In some embodiments, particularly when the mold compound 32 is very thin and the diameter of the via 36 is large, contacts 28 may not be required.

A mold compound 30 is used to encapsulate the package 10. The mold compound 30 is mainly made of non-conductive paste, film, or the like. The mold compound 30 is used to encapsulate the die 18, exposed areas on the first surface of the substrate 12, and the contacts 28.

Referring to FIG. 4B, a conductive coating 32 is then applied to the package 10. The conductive coating 32 is used to provide RF shielding for the package 10. The conductive coating 32 is applied to the top surface of the package 10 and to the side surfaces of the package 10. The conductive coating 32 is applied so that the conductive coating 32 will be in contact with metal traces 16 that are ground planes. In the present embodiment, the metal traces 16 are a set of exposed metal traces 16a on a side surface of the substrate 12. Thus, the package 10 will have a conductive coating 32 that contacts grounded metal. If all four sides of the package 10 have exposes metal traces 16a, the conductive coating 32 will contact ground metal on all four sides of the package 10.

Figure 4C:
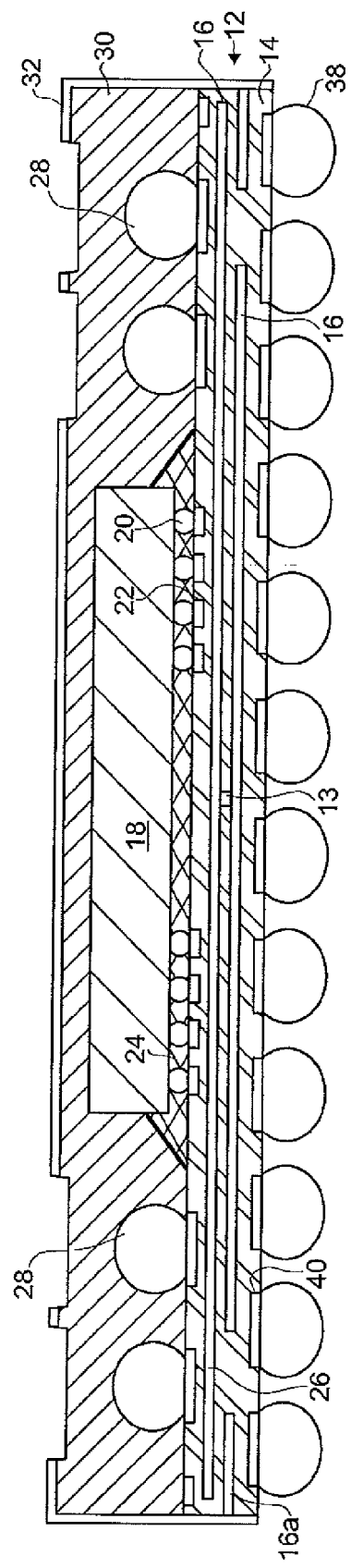

Referring to FIG. 4C, the conductive coating 32 and portion of mold compound 30 above each of the contacts 28 (or above the land pad 26 if contacts 28 are not used) is removed. The amount of conductive coating 32 removed is slightly more than the width of the contact 28/land pad 26. The conductive coating 32 may be removed mask printing process, laser ablation, a selective plating process, and the like. Other methods may be used to remove the conductive coating 32 without departing from the spirit and scope of the present invention.

Figure 4D:
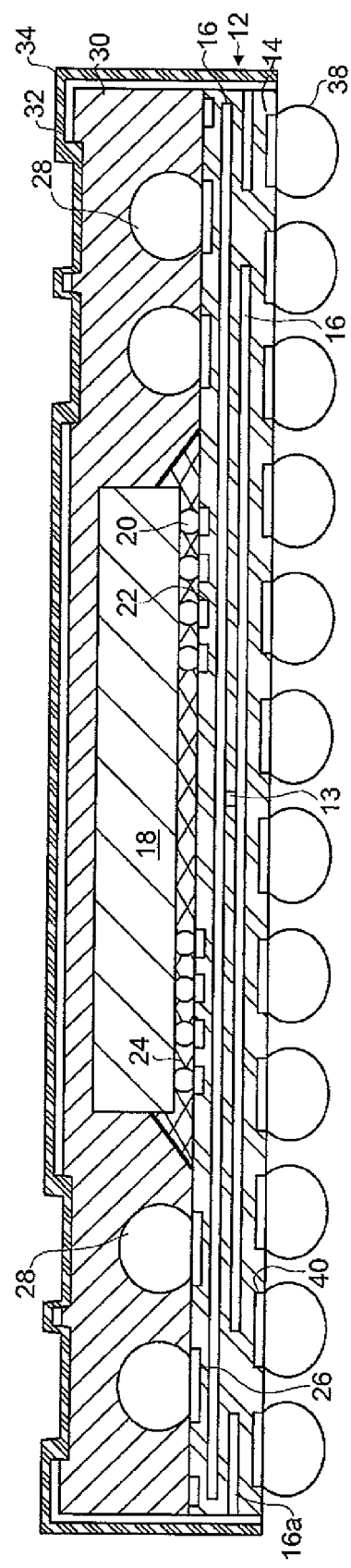

Referring to FIG. 4D, a non-conductive coating 34 is then applied to the package 10 and cured. The non-conductive coating 34 is applied to the conductive coating 32 and to the mold compound 30 where the conductive coating 32 was removed. The non-conductive coating 34 will cover the exposed sections of the conductive coating 32. The non-conductive coating 34 may be a ceramic, silicon, a polymer, or the like. The listing of the above types of non-conductive coatings 34 is given as an example and should not be seen as limiting the scope of the present invention.

Figure 4E:
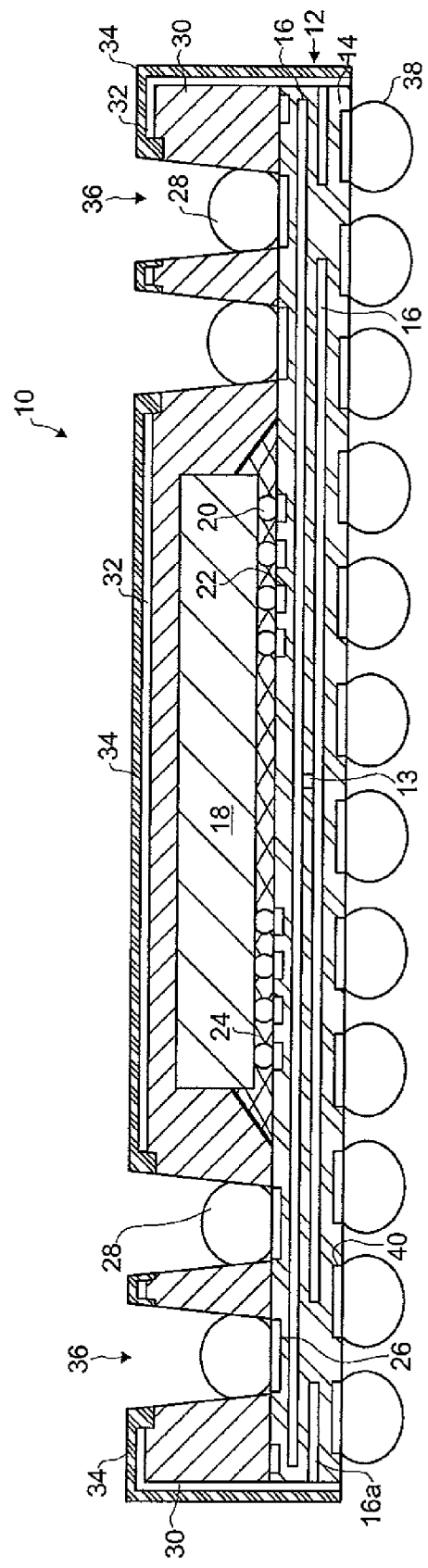

Referring to FIG. 4E, a plurality of vias 36 is formed in the package 10. Each of the vias 36 extends through the non-conductive coating 34 and the mold compound 30 to a top surface of a respective contact 28 (or above the land pad 26 if contacts 28 are not used). Each of the vias 36 has a frusto-conical configuration having the non-conductive coating 34 formed around the inner top perimeter of each via 36. In general, the number of vias 36 formed in the package 10 conforms to the number of contacts 28. The vias 36 allow contacts from another package to be placed on top of the package 10 and be in electrically coupled to the contacts 28.

A set of contacts 38 may be coupled to the second surface of the substrate 12. In the embodiment shown in FIG. 1, the contacts 38 are solder balls. If solder balls are used, the solder balls will be electrically coupled to the second surface of the substrate 12 via land pads 40. In general, a reflow process may be used to couple the solder balls to the land pads 40 formed on the second surface of the substrate 12. Alternative methods may be used to couple different types of contacts to the first substrate 12 without departing from the spirit and scope of the present invention.

Figure 5:
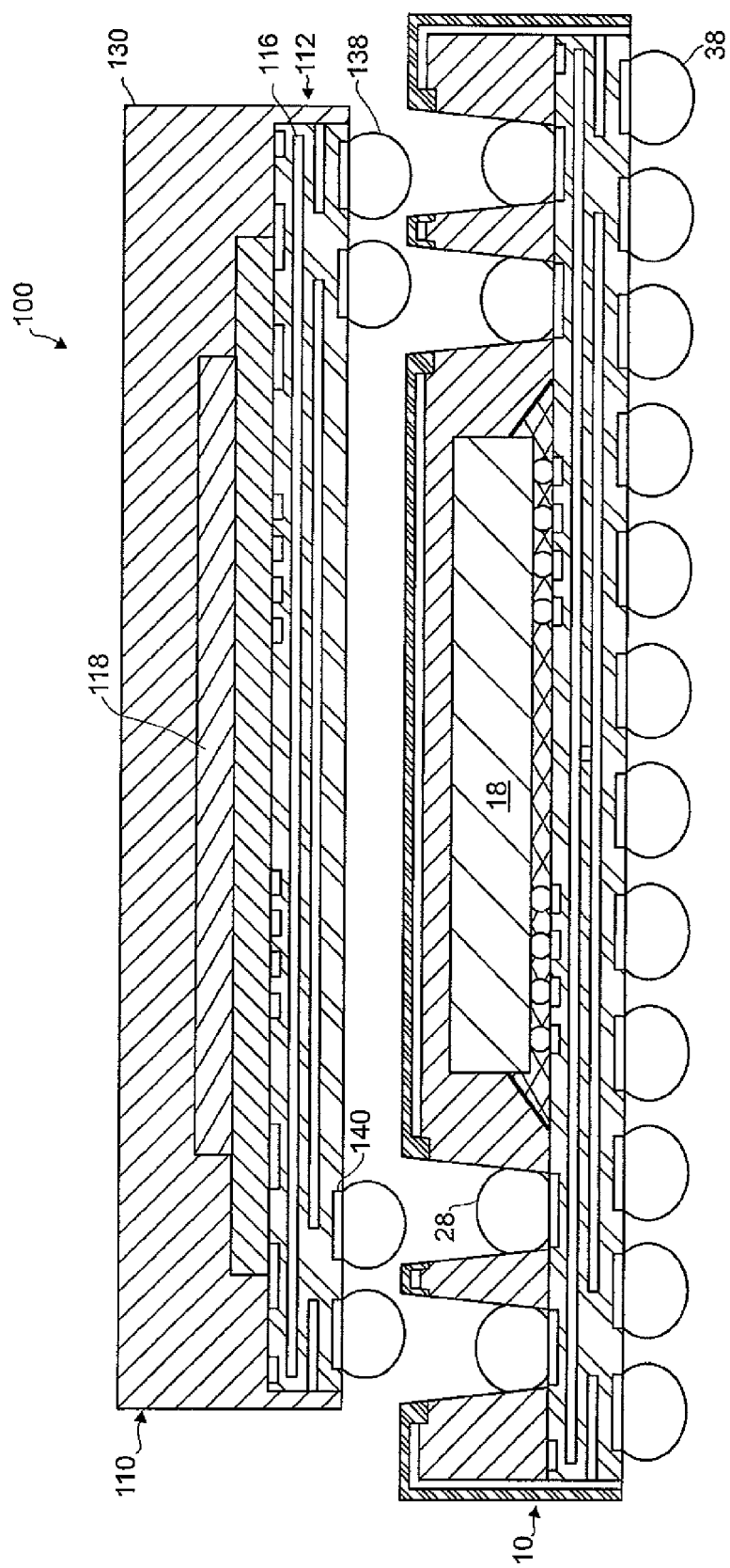
FIG. 5 shows a second package being stacked on to the semiconductor package of FIG. 1.

Referring now to FIG. 5, an exploded view of a stacked PoP package 100 is shown. The package 100 uses the package 10 or 10A (hereinafter package 10) as a base package. A second package 110 is then attached to the top surface of the package 10. The second package 110 has a substrate 112 having a plurality of metal traces 116. One or more dies 118 are attached to a first surface of the substrate 112. Different methods may be used to electrically couple the die 118 to the substrate 112. Wirebonds, surface mount technology, through hole technology, flip chip technology, and the like may be used.

A mold compound 130 is used to encapsulate the package 100. The mold compound 130 is mainly made of non-conductive resin, film, or the like. The mold compound 130 is used to encapsulate the die 118 and exposed areas on the first surface of the substrate 112.

A set of solder ball contacts 138 may be coupled to the second surface of the substrate 112. The solder ball contacts 138 will be electrically coupled to the second surface of the substrate 112 via land pads 140. The solder ball contacts 138 are then electrically coupled to the contacts 28 (or to the land pad 26 if contacts 28 are not used) in order to electrically attach the second package 110 to the package 10.

The package 10 provides shielding on a top surface and all four sides surfaces of the package 10 and provides isolation between the package 10 and the second package 110 to be stacked on a top surface of the package 10. The shielding on the top surface has minimal openings that allow the second package 110 to be electrically coupled to the package 10. The non-conductive coating 34 provides isolation between the conductive coating 32 and signal transmitted from solder joints between the stacked packages.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a first substrate having a plurality of metal traces;
   at least one die electrically coupled to a first surface of the first substrate;
   a plurality of land pads formed on the first surface of the first substrate;
   a mold compound encapsulating portions of the die and portions of the first surface of the substrate;
   a conductive coating applied to the mold compound and electrically coupled to at least one metal trace;
   a non-conductive coating formed over the conductive coating and portions of the mold compound;
   a plurality of vias, wherein each of the plurality of vias is formed through both the non-conductive coating and the mold compound and exposes one of the land pads; and
   a plurality of contacts, wherein an individual contact is formed on each of the lad pads and positioned in a bottom section of each of the plurality of vias, wherein a top area of each of the plurality of vias below the non-conductive coating remains open for electrically attaching a top semiconductor package to each of the plurality of contacts.

2. The semiconductor package of claim 1, wherein the conductive coating is applied to and electrically attached to an exposed metal trace on at least one side surface of the first substrate.

3. The semiconductor package of claim 1, further comprising wirebonds electrically connecting the conductive coating to the at least one metal trace.

4. The semiconductor package of claim 1, wherein the plurality of vias are frusto-conical in shape.

5. The semiconductor package of claim 1, wherein a top interior perimeter of each of the plurality of vias is formed in the non-conductive coating.

6. The semiconductor package of claim 1, further comprising a second plurality of contacts electrically coupled to a second surface of the substrate.

7. The semiconductor package of claim 1, wherein the top semiconductor package comprises:
   a second substrate;
   at least one second die electrically coupled to a first surface of the second substrate;
   a plurality of solder ball contacts electrically coupled to a second surface of the second substrate wherein each of the plurality of solder ball contacts are electrically attached to one of the plurality of contacts formed on the land pads exposed through the plurality of vias; and
   a second mold compound encapsulating exposed portions of the second die and the first surface of the second substrate.

8. The semiconductor package of claim 1, wherein the non-conductive coating is one selected from: a ceramic, a silicon, a polymer, or combinations thereof.

9. A semiconductor package comprising:
   a first substrate having a plurality of metal traces;
   at least one die electrically coupled to a first surface of the first substrate;
   a plurality of land pads formed on the first surface of the first substrate;
   a mold compound encapsulating portions of the die and the land pads;
   a conductive coating applied to the mold compound and electrically coupled to at least one metal trace;
   a non-conductive coating formed over the conductive coating and portions of the mold compound;
   a plurality of vias, wherein each of the plurality of vias is formed through both the non-conductive coating and the mold compound and exposes one of the land pads;
   a plurality of contacts, wherein an individual contact is formed on each of the lad pads and positioned in a bottom section of each of the plurality of vies, wherein a top area of each of the plurality of vias below the non-conductive coating remains open; and
   a top semiconductor package having a plurality of solder ball contacts, the plurality of solder ball contacts positioned in the open top area of the plurality of vias and electrically attached to one of the plurality of contacts formed on one of the land pads.

10. The semiconductor package of claim 9, wherein the conductive coating is applied to and electrically attached to an exposed metal trace on at least one side surface of the first substrate.

11. The semiconductor package of claim 9, further comprising wirebonds electrically connecting the conductive coating to the at least one metal trace.

12. The semiconductor package of claim 9, wherein a top interior perimeter of each of the plurality of vias is formed in the non-conductive coating.

13. The semiconductor package of claim 9, wherein the top semiconductor package comprises:
   a second substrate;
   at least one second die electrically coupled to a first surface of the second substrate;
   the plurality of solder ball contacts electrically coupled to a second surface of the second substrate wherein the plurality of solder ball contacts are electrically attached to the plurality of contacts exposed through the plurality of vias; and
   a second mold compound encapsulating the top semiconductor package.

14. A semiconductor package comprising:
   a first substrate having a plurality of metal traces;
   at least one die electrically coupled to the first surface of the first substrate;
   a plurality of land pads formed on the first surface of the first substrate;
   a mold compound encapsulating portions of the die and portions of the first surface of the substrate;
   means for providing RF shielding applied to the mold compound and electrically coupled to at least one metal trace;
   means for providing a protective layer formed over the means for providing RF shielding and portions of the mold compound;
   a plurality of vias, wherein each of the plurality of vias is formed through both the means for providing a protective layer and the mold compound and exposes one of the land pads; and
   a plurality of contacts, wherein an individual contact is formed on each of the lad pads and positioned in a bottom section of each of the plurality of vias, wherein a top area of each of the plurality of vias below the means for providing a protective layer remains open for electrically attaching a top semiconductor package to each contact.

15. The semiconductor package of claim 14, wherein the means for providing RF shielding is applied to and electrically attached to an exposed metal trace on at least one side surface of the substrate.

16. The semiconductor package of claim 14, further comprising means for electrically connecting the means for providing RF shielding to the at least one metal trace.

17. The semiconductor package of claim 14, further comprising:
   a second substrate;
   at least one second die electrically coupled to a first surface of the second substrate;
   a plurality of solder ball contacts electrically coupled to a second surface of the second substrate wherein each of the plurality of solder ball contacts are electrically attached to one of the plurality of contacts exposed through the plurality of vias; and
   a second mold compound encapsulating exposed portions of the second die and the first surface of the second substrate.

\* \* \* \* \*